US006346711B1

(12) United States Patent
Bray

(10) Patent No.: US 6,346,711 B1
(45) Date of Patent: Feb. 12, 2002

(54) HIGH-SPEED OPTOCOUPLER DRIVER

(75) Inventor: Derek Bray, Los Altos, CA (US)

(73) Assignee: Infineon Technologies North America Corp., Iselin, NJ (US)

( * ) Notice: Subject to any disclaimer, the term of this patent is extended or adjusted under 35 U.S.C. 154(b) by 0 days.

(21) Appl. No.: 09/342,532

(22) Filed: Jun. 29, 1999

(51) Int. Cl.[7] .............................................. G02B 27/00
(52) U.S. Cl. ................................ 250/551; 250/214 R
(58) Field of Search ........................... 250/205, 214 R, 250/551; 369/100, 116, 120; 327/530, 535, 540, 547; 257/80.83

(56) References Cited

U.S. PATENT DOCUMENTS 5,061,859 A 10/1991 Lovelace et al. ............ 250/551
5,502,298 A * 3/1996 Geller ......................... 250/205
5,742,133 A 4/1998 Wilhelm et al. ............. 315/291

FOREIGN PATENT DOCUMENTS

| EP | 0 441 965 | 8/1991 | ........... H01L/33/00 |
| EP | 0 470 780 | 2/1992 | ........... H03K/5/01 |
| EP | 0 542 480 | 5/1993 | ........... H03K/17/04 |
| EP | 0 704 993 | 4/1996 | ........... H04B/10/00 |
| WO | WO 99/01012 | 1/1999 | ........... H05B/33/08 |

* cited by examiner

Primary Examiner—Que T. Le
(74) Attorney, Agent, or Firm—Fish & Richardson P.C.

(57) ABSTRACT

The response time of a driver for an LED optocoupler is improved by adding a pedestal current component ($I_P$) to the LED drive on turn-on. The pedestal current speeds up or accelerates the turn-on process by providing an additional amount of current for a short period of time.

7 Claims, 3 Drawing Sheets

HIGH-SPEED OPTOCOUPLER DRIVER

BACKGROUND OF THE INVENTION

To achieve speed in an optical coupler, the light source, such as a light emitting diode or LED, must be switched on and off rapidly. The driver described here provides rapid switching by generating several different, time-varying current components. The performance of the driver is enhanced by adding a pedestal current to the illuminating current for a period of time. Collectively, all of the applied currents help the LED to rapidly change from the "off" state to the "on" state and back again.

DESCRIPTION OF THE INVENTION

The switching performance of an LED can be improved by controlling the current flowing into or out of the LED. This is accomplished by providing several current components to the LED over the cycle of illumination.

Figure 1:
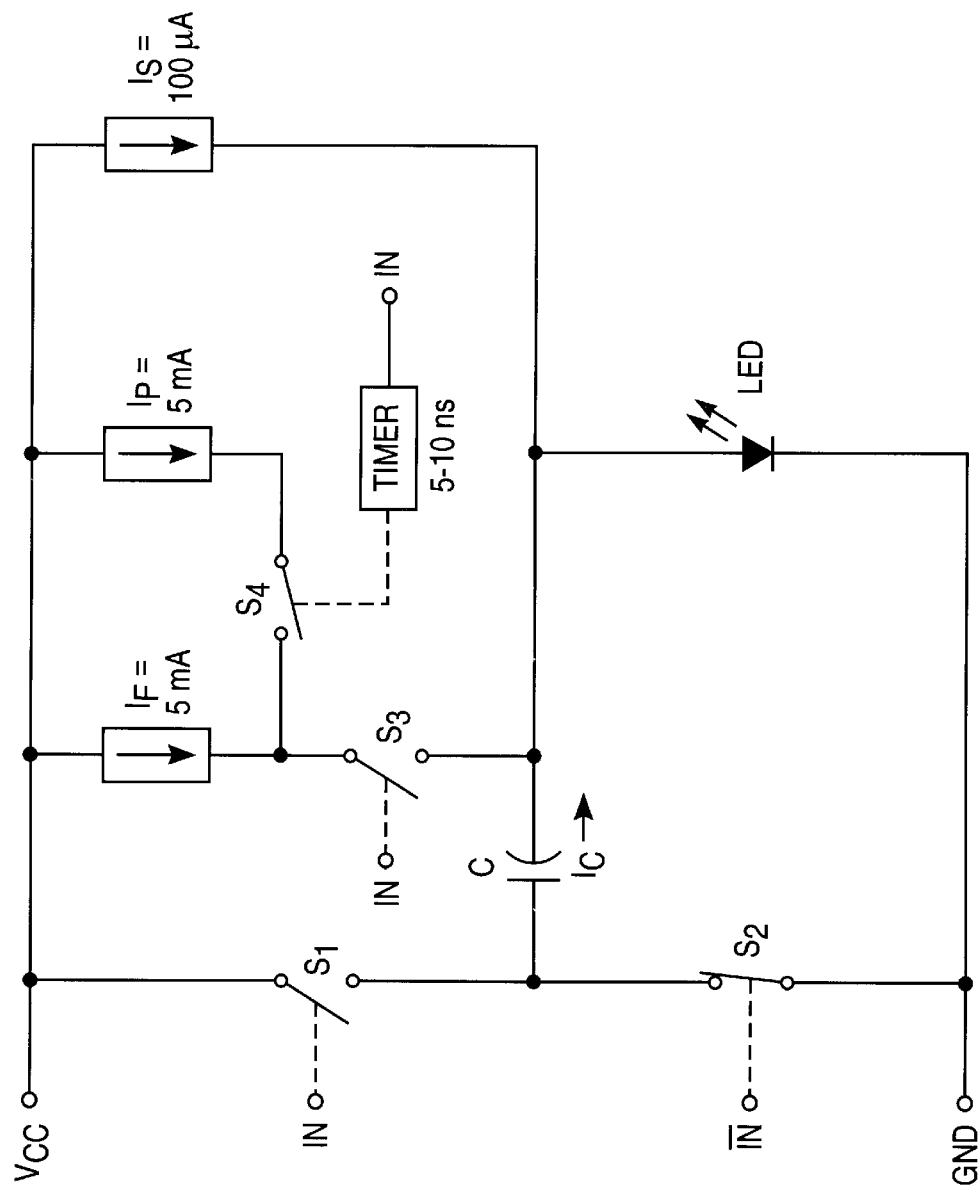
FIG. 1 is a conceptual schematic block diagram of a driver circuit.

As illustrated in FIG. 1, an LED is connected to a node joining a standby current source $I_S$, a capacitor C, a final drive current source $I_F$, and a pedestal current source $I_P$. The first-mentioned source, $I_S$, directs a continuous but non-illuminating current through the LED. This current insures that there will always be a base charge in the LED, alleviating the need to charge the diode from zero and minimizing the voltage swing from the "off" state to the "on" state, shortening the time to turn on the diode. The value of standby current will of course depend on the LED employed and the value of $V_{CC}$. In the case of a Showa Denko infrared BCH-35 LED, the standby current can be in the range of 100 $\mu$A. Of course, one may employ a different LED to suit the application.

To turn on the LED, $S_1$ and $S_3$ are closed while $S_2$ is opened. The closing of $S_1$ connects C to $V_{CC}$, pulling a large current into and through C and hence through the LED as well. Although it does not substantially change the instantaneous voltage across the LED, it does compensate for the capacitance or, in other words, provides the differential component of charge the diode absorbs when it traverses from the "off" state to the "on" state.

The third source, $I_F$, provides the component of current that results in illumination. In the case of a BCH-35 LED, a final drive current of 5 mA is sufficient to achieve that result.

The fourth source, $I_P$, provides a component of current that speeds up or accelerates the turn-on process by providing an additional amount of current for a short period of time. In the example of FIG. 1, a timer begins operating when $S_1$ and $S_3$ close, and it opens $S_4$ after 5–10 ns for applications where the switching speed is approximately 50 MBd, or some other user-selected time period. While $S_4$ is closed, a pedestal current is applied to the LED, in addition to the other current components. The ratio of $I_P$ to $I_F$ is approximately 1:1, but other ratios may be employed.

Figure 2:
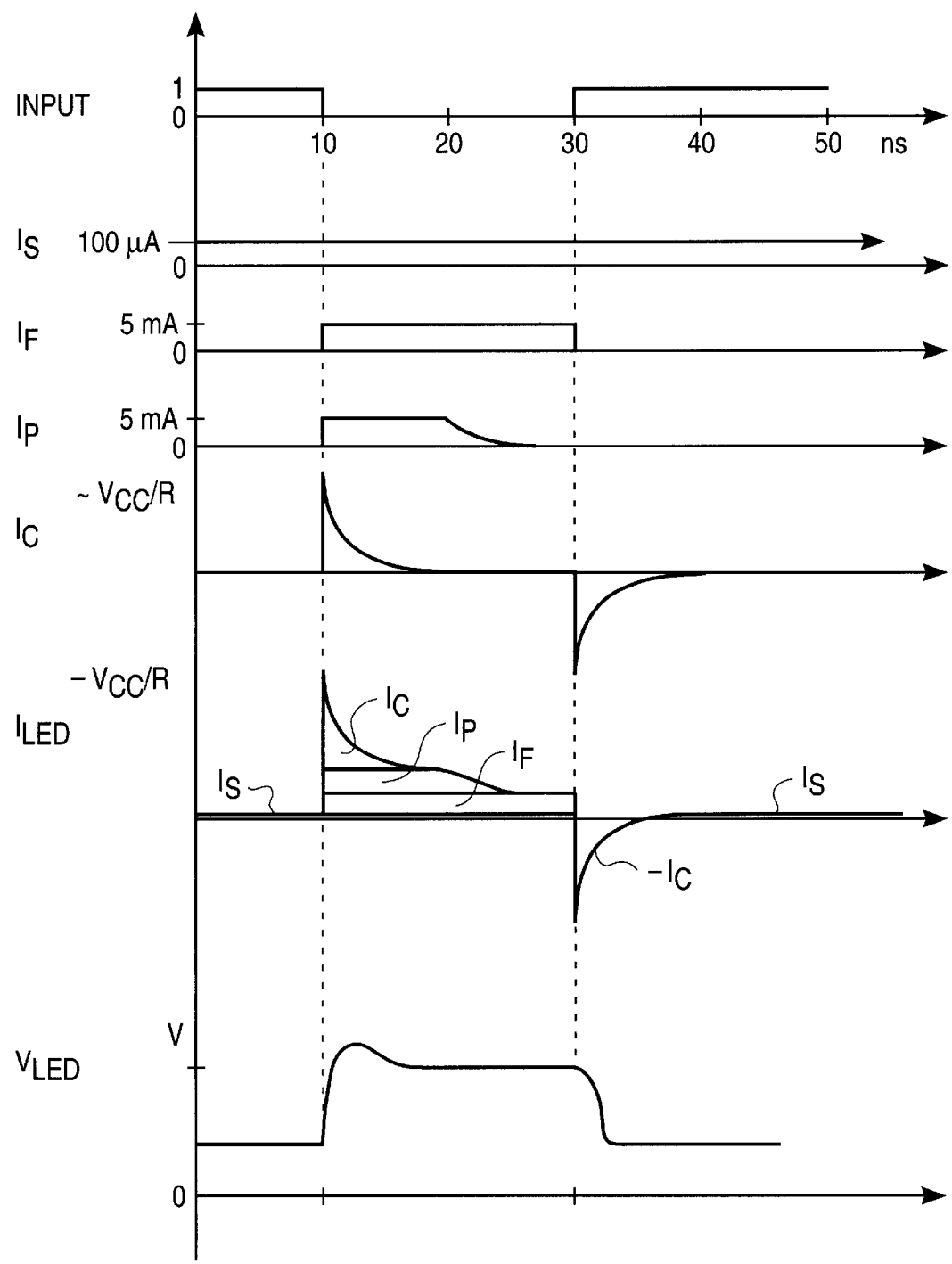
FIG. 2 is a waveform diagram for the circuit of FIG. 1.

The composite current is shown as $I_{LED}$ in the waveform diagram of FIG. 2. Also, the voltage across the LED versus time is shown in the waveform directly below $I_{LED}$. The values of current, voltage, and timing are specific to the LED employed and will change as dictated by the components used and the application.

When the LED is turned off, $S_1$ and $S_3$ open. $I_F$ and $I_P$ are now disconnected from the LED. Additionally, $S_2$ closes, connecting the capacitor C to ground. This forces C to discharge to ground, pulling out current from the LED and bringing the charge down to the level dictated by $I_S$. Now, the voltage across the LED is at the "off" state level.

Figure 3:
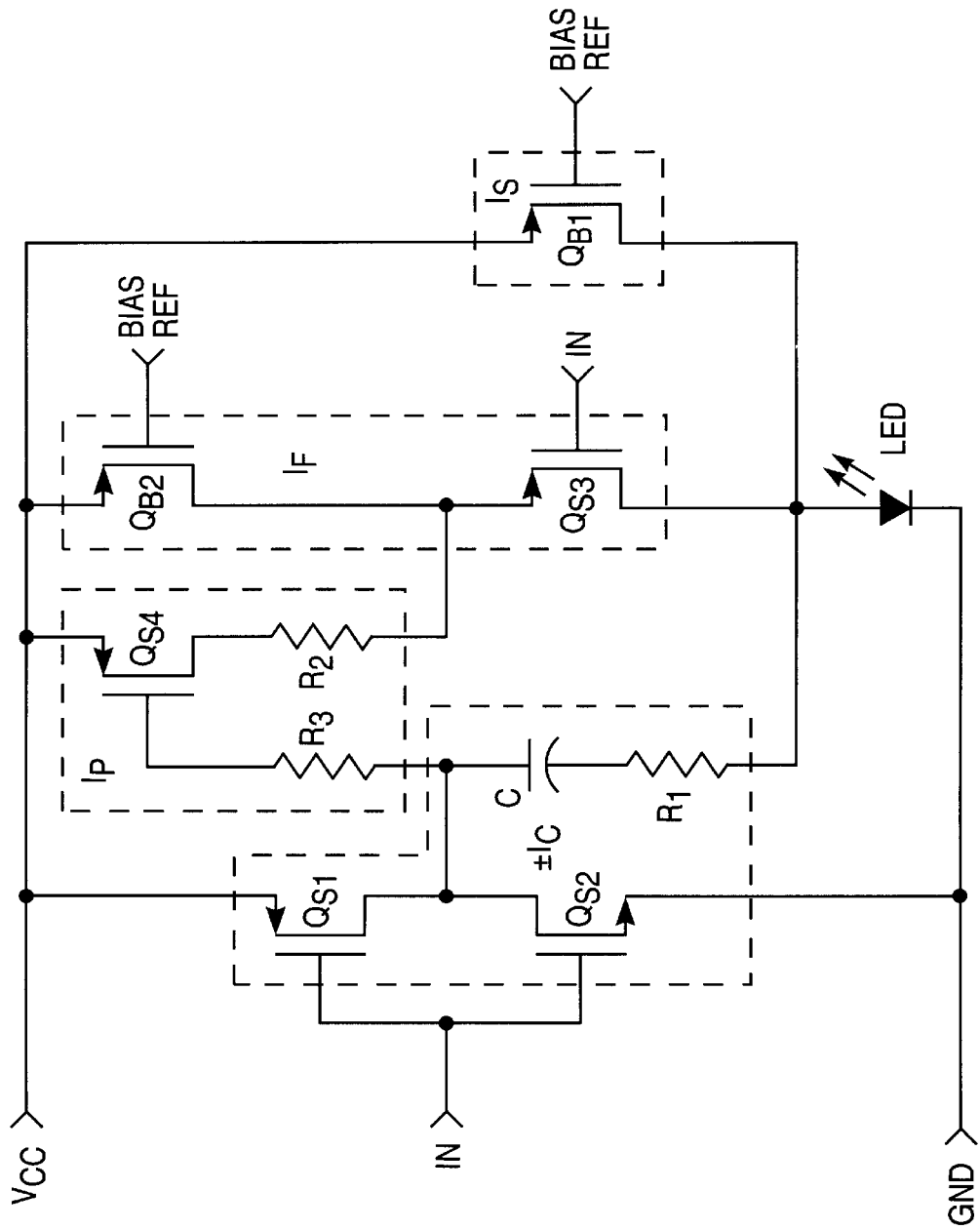
FIG. 3 is a specific implementation of the circuit of FIG. 1.

A specific implementation of the driver circuit is shown in FIG. 3. The components comprising each of the current sources of FIG. 1 are shown encompassed by dashed lines and labels $I_S$, $I_F$, $I_P$, and $I_C$. The switches are implemented as switching transistors $Q_{S1}$, $Q_{S2}$, $Q_{S3}$, and $Q_{S4}$, corresponding to the switches $S_1$, $S_2$, $S_3$, and $S_4$ of FIG. 1.

The standby current source $I_S$ is implemented in a MOS transistor $Q_{B1}$ biased to provide the desired level of drain current, e.g., 100 $\mu$A. The capacitive source C is current limited by a resistor $R_1$ and switched by $Q_{S1}$ and $Q_{S2}$ in the same fashion as $S_1$ and $S_2$ in FIG. 1.

The final drive current source $I_F$ is implemented by a biased transistor $Q_{B2}$ connected to the LED through switching transistor $Q_{S3}$. The latter transistor also connects $Q_{S4}$ and current limiting resistor $R_2$, together providing the pedestal current $I_P$. The pedestal current may vary from 5–10 mA, but other values could be used as dictated by the application. $Q_{S4}$ is controlled by the combination of $R_3$ and the gate capacitance of $Q_{S4}$ (implementing the timer of FIG. 1). When $Q_{S1}$ turns on, voltage is applied to $R_3$, and the time constant of the resistor and gate capacitance delay the pinch-off of $Q_{S4}$ until the voltage rises to the appropriate level.

To turn off the LED, $Q_{S1}$ and $Q_{S3}$ are turned off, disconnecting $I_F$, and $Q_{S2}$ is turned on, discharging the capacitor C and the LED.

For the BCH-35 LED, $R_1$ can have a value of 120 ohms, $R_2$ can be 500 ohms, $R_3$ can be 5K ohms, and C can be 7.5 pF. The value of the capacitor is selected, using he familiar relationship Q=CV, to provide a charge corresponding to the change in voltage across the LED. It should be understood that these values were found satisfactory for the particular application; should a different LED be employed or if it is desired to modify the performance of the circuit, the values may need to be modified.

The LED will usually have a light output having a negative temperature coefficient. To insure uniformity in light output over a range of temperatures, the bias voltages provided to transistors $Q_{B1}$ and $Q_{B2}$ are generated by a source (or sources) having a positive temperature coefficient.

The foregoing circuits may be fabricated as integrated circuits or as discrete components. Also, while values have been provided in the schematics and drawings, or specified in the text for some of the components, voltages, and currents, it should be recognized that other values could be used to suit the application. A person of skill in the art will also appreciate that the current sources, switches and timer can be implemented in various different ways using various different components and that the invention can be implemented in various different circuit configurations.

What is claimed is:

1. A driver for a light emitting diode (LED), comprising:
    a current source for selectively providing an illuminating current level for the LED; and
    a current source for selectively providing a pedestal current for the LED for a predetermined period of time.

2. A driver as set forth in claim 1, further comprising means for selectively adding and removing charge from the LED.

3. A driver as set forth in claim 2, further comprising a current source for maintaining a standby current through the LED.

4. A driver for a light emitting diode (LED), comprising:
   a control signal input;
   a transistor biased to provide a constant standby current through the LED;
   a switched capacitive current source, responsive to the control signal input, for adding or removing charge from the LED, the capacitive current source comprising a capacitor and a current-limiting resistor;
   a switched final drive current source, responsive to the control signal input, for providing a current level for illuminating the LED, the final drive current source comprising a biased transistor; and
   a switched, timed pedestal current source, responsive to the control signal input, for providing a pedestal current for the LED for a predetermined period of time, the pedestal current source comprising a transistor and a current-limiting resistor.

5. A method of driving a light emitting diode (LED) comprising the steps of:
   selectively providing an illuminating current level for the LED; and
   selectively providing a pedestal current for the LED for a predetermined period of time.

6. A method as set forth in claim 5, further comprising the step of selectively adding and removing charge from the LED.

7. A method as set forth in claim 6, further comprising the step of maintaining a standby current through the LED.

* * * * *